(12) United States Patent
Hwang

(10) Patent No.: US 8,628,991 B2
(45) Date of Patent: Jan. 14, 2014

(54) SOLAR CELL AND METHOD FOR MANUFACTURING THE SAME

(75) Inventor: Sung-Ho Hwang, Seoul (KR)

(73) Assignee: Samsung Display Co., Ltd. (KR)

( * ) Notice: Subject to any disclaimer, the term of this patent is extended or adjusted under 35 U.S.C. 154(b) by 535 days.

(21) Appl. No.: 12/917,760

(22) Filed: Nov. 2, 2010

(65) Prior Publication Data
US 2011/0272017 A1 Nov. 10, 2011

(30) Foreign Application Priority Data

May 10, 2010 (KR) .................. 10-2010-0043305

(51) Int. Cl.
H01L 21/00 (2006.01)
(52) U.S. Cl.
USPC .................. 438/57; 257/E25.009
(58) Field of Classification Search
USPC ........ 438/57, 66; 136/243–265; 257/E25.009
See application file for complete search history.

(56) References Cited

U.S. PATENT DOCUMENTS

| 5,118,361 A * | 6/1992 | Fraas et al. ..................... 136/246 |
| 7,964,499 B2 * | 6/2011 | Kim et al. ..................... 438/652 |
| 8,163,638 B2 * | 4/2012 | De Ceuster et al. .......... 438/558 |

FOREIGN PATENT DOCUMENTS

| JP | 11046005 | 2/1999 |
| JP | 11238689 | 8/1999 |
| JP | 2006111954 | 4/2006 |
| JP | 2008060207 | 3/2008 |
| JP | 2008124413 | 5/2008 |
| KR | 1020020031489 | 5/2002 |
| KR | 1020020059185 | 7/2002 |
| KR | 100855682 | 8/2008 |
| KR | 1020090007127 A | 1/2009 |
| KR | 1020090031117 A | 3/2009 |

* cited by examiner

Primary Examiner — Brook Kebede
(74) Attorney, Agent, or Firm — Cantor Colburn LLP

(57) ABSTRACT

A solar cell includes a semiconductor layer which includes a p-type impurity containing layer and an n-type impurity-containing layer; a dielectric layer disposed on one side of the semiconductor layer, wherein the dielectric layer has an isotropically etched portion on the surface thereof; a first electrode electrically connected with the p-type impurity-containing layer in the semiconductor layer; and a second electrode electrically connected with the n-type impurity-containing layer in the semiconductor layer.

8 Claims, 4 Drawing Sheets

SOLAR CELL AND METHOD FOR MANUFACTURING THE SAME

This application claims priority to Korean Patent Application No. 10-2010-0043305, filed on May 10, 2010, and all the benefits accruing therefrom under 35 U.S.C. §119, the content of which in its entirety is herein incorporated by reference.

BACKGROUND OF THE INVENTION

1. Field

This disclosure generally relates to a solar cell and a method of manufacturing the same.

2. Description of the Related Art

A solar cell is a photoelectric conversion device converting photonic energy, e.g., solar energy, into electrical energy, and has been recognized as a renewable and pollution-free next generation energy source.

If a solar cell absorbs photonic energy, e.g., solar energy, in a photoactive layer, electron-hole pairs ("EHPs") are produced in a semiconductor, and the produced electrons and holes move to an n-type semiconductor and a p-type semiconductor, respectively, and are collected at an electrode, and thus photonic energy may be converted into electrical energy.

In order to produce substantially large quantities of electrical energy, it is important for a solar cell to effectively trap light entering the solar cell, and effectively collect electrons and holes produced due to the trapped light.

BRIEF SUMMARY OF THE INVENTION

An exemplary embodiment provides a solar cell capable of effectively producing electrical energy from photonic energy, e.g., solar energy.

Another exemplary embodiment provides a method of manufacturing the solar cell.

According to the present invention, an exemplary embodiment of the solar cell includes a semiconductor layer which includes a p-type impurity-containing layer and an n-type impurity-containing layer, a dielectric layer which is disposed on one side of the semiconductor layer and which has an isotropically etched portion in a surface thereof, a first electrode electrically connected with the p-type impurity-containing layer in the semiconductor layer, and a second electrode electrically connected with the n-type impurity-containing layer in the semiconductor layer.

In one exemplary embodiment, the dielectric layer may have a lower refractive index than the semiconductor layer.

In one exemplary embodiment, the dielectric layer may have refractive index of about 1.1 to about 2.2, and the semiconductor layer may have refractive index of about 3.4 to about 4.4.

In one exemplary embodiment, the dielectric layer may include silicon oxide, silicon nitride, silicon oxynitride, aluminum oxide, other materials with similar characteristics, or a combination thereof.

In one exemplary embodiment, the isotropically etched portion may have a concave lens shape.

In one exemplary embodiment, the isotropically etched portion may have a pitch of about 0.5 micrometers ($\mu m$) or more.

In one exemplary embodiment, the isotropically etched portion may have a pitch of about 0.5 $\mu m$ to about 2 $\mu m$.

In one exemplary embodiment, the surface of the semiconductor layer that is in contact with the dielectric layer may be substantially flat.

Another exemplary embodiment of the method for manufacturing a solar cell includes providing a semiconductor layer which includes a p-type impurity-containing layer and an n-type impurity-containing layer, disposing a dielectric layer on the front side of the semiconductor layer, forming a photosensitive pattern on the dielectric layer, isotropically etching a surface of the dielectric layer using the photosensitive pattern, providing a first electrode electrically connected with the p-type impurity-containing layer, and providing a second electrode electrically connected with the n-type impurity-containing layer.

In one exemplary embodiment, the isotropic etching of the surface of the dielectric layer may be performed by wet method using an acid-containing solution.

In one exemplary embodiment, the isotropically etched surface of the dielectric layer may be formed in the shape of a plurality of concave lens.

In one exemplary embodiment, the isotropically etched surface of dielectric layer may have a pitch of about 0.5 $\mu m$ or more.

In one exemplary embodiment, the isotropically etched surface of the dielectric layer may have a pitch of about 0.5 $\mu m$ to about 2 $\mu m$.

In one exemplary embodiment, the dielectric layer may have lower refractive index than the semiconductor layer.

In one exemplary embodiment, the dielectric layer may have refractive index of about 1.1 to about 2.2, and the semiconductor layer may have refractive index of about 3.4 to about 4.4.

In one exemplary embodiment, the dielectric layer may include silicon oxide, silicon nitride, silicon oxynitride, aluminum oxide, other materials with similar characteristics, or a combination thereof.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION OF THE INVENTION

Figure 1:
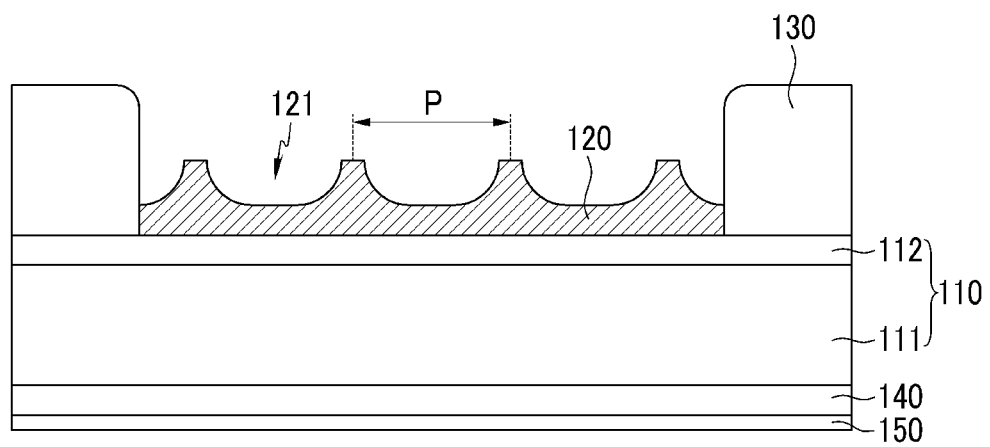
FIG. 1 is a cross-sectional view schematically showing an exemplary embodiment of a solar cell according to the present invention.

The general inventive concept now will be described more fully hereinafter with reference to the accompanying drawings, in which various exemplary embodiments are shown. This invention may, however, be embodied in many different forms, and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular exemplary embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized exemplary embodiments. As such, variations from the shapes of the illustrations as a result, for example, of manufacturing techniques and/or tolerances, are to be expected. Thus, exemplary embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

Figure 2:
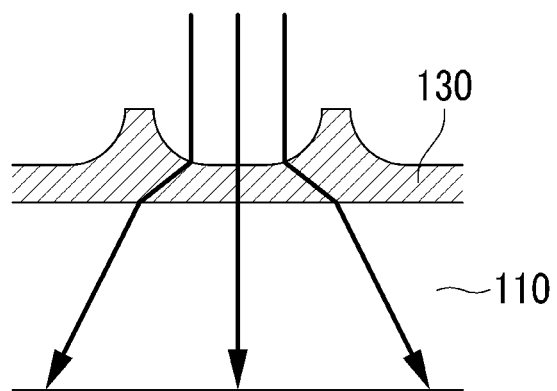
FIG. 2 is a schematic view showing a path of light entering the exemplary embodiment of the solar cell of FIG. 1.

Referring to FIG. 1 and FIG. 2, an exemplary embodiment of a solar cell according to the present invention will be explained hereinafter.

FIG. 1 is a cross-sectional view schematically showing an exemplary embodiment of the solar cell according to the present invention, and FIG. 2 is a schematic view showing the path of light entering the exemplary embodiment of the solar cell of FIG. 1.

Hereinafter, for better understanding and ease of description, an upper and lower positional relationship is described with respect to the center of the semiconductor substrate 110, but it should not be interpreted as limiting the exemplary embodiments. In addition, a "front side" may indicate the side that receives photonic energy, e.g., solar energy in a semiconductor substrate 110, and a "rear side" may indicate the other opposite side to the front side of the semiconductor substrate 110.

Referring to FIG. 1, an exemplary embodiment of the solar cell according to the present invention includes a semiconductor substrate 110 which includes a lower semiconductor layer 111 and an upper semiconductor layer 112.

In one exemplary embodiment, the semiconductor substrate 110 may include crystalline silicon, and the crystalline silicon may be a silicon wafer, or other materials with similar characteristics, for example. One of the lower semiconductor layer 111 and the upper semiconductor layer 112 may be a p-type impurity doped semiconductor layer, and the other may be an n-type impurity doped semiconductor layer. The p-type impurity may be a Group III compound such as boron (B), or other materials with similar characteristics, and the n-type impurity may be a Group V compound such as phosphorous (P), or other materials with similar characteristics, for example.

An upper dielectric layer 120 is disposed on the semiconductor substrate 110.

The upper dielectric layer 120 may function as an anti-reflection coating ("ARC") that substantially reduces light reflectance at a surface of a solar cell and substantially increases selectivity of a specific wavelength region for absorption. In addition, the upper dielectric layer 120 may substantially improve a contact characteristic with silicon included in a surface of the semiconductor substrate 110, thus increasing efficiency of the solar cell.

The upper dielectric layer 120 may include a material which has a lower refractive index than the semiconductor substrate 110. In one exemplary embodiment, when a semiconductor substrate 110 includes silicon such as a silicon wafer which has a refractive index of about 3.4 to about 4.4, the upper dielectric layer 120 may have a refractive index of about 1.1 to about 2.2. The material which has the above refractive index may include silicon oxide ($SiO_2$), silicon nitride ($SiN_x$), silicon oxynitride (SiON), aluminum oxide ($Al_2O_3$), other materials with similar characteristics, or a combination thereof, for example.

As explained above, an upper dielectric layer 120 having a lower refractive index than a refractive index of the semiconductor substrate may be disposed on a front, i.e., light-receiving, side of the semiconductor substrate 110, thereby lowering light reflectance to reduce light loss and increase light absorption at the surface of the solar cell.

The surface of the upper dielectric layer 120 has isotropically etched portions. In one exemplary embodiment, the isotropically etched portions may have a structure wherein a plurality of recess portions 121 having a concave lens shape is arranged regularly as shown in FIG. 1. In one exemplary embodiment, the plurality of recess portions 121 having a concave lens shape may be arranged irregularly.

When the isotropically etched portions are regularly arranged, the isotropically etched portion may have a pitch of about 0.5 micrometers (μm) or more. In one exemplary embodiment, the pitch may be form about 0.5 μm to 2 μm. If the isotropically etched portion has a pitch within the above range, the upper dielectric layer 120 may more efficiently absorb light and refract the light into the semiconductor layer than a comparative embodiment not having the isotropically etched portion or having an isotropically etched portion with a pitch outside of the proscribed range.

Referring to FIG. 2, when substantially vertical incident light passes through the upper dielectric layer 120, light is refracted with a substantially large refraction angle due to the shape of the isotropically etched portion, thereby passing the semiconductor substrate 110 along an inclined path instead of a substantially vertical path. As such, since some of the incident light passes the semiconductor substrate 110 along the inclined path, a light pathway through the semiconductor substrate 110 may be lengthened, thereby increasing the amount of light absorbed in the semiconductor substrate 110.

Figure 5:
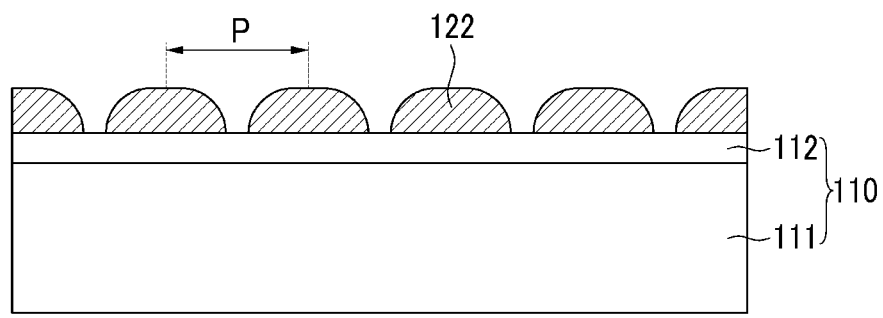
FIG. 5 and FIG. 6 are schematic views respectively showing exemplary embodiments of surface texturing of an upper dielectric layer according to the present invention.
Figure 6:
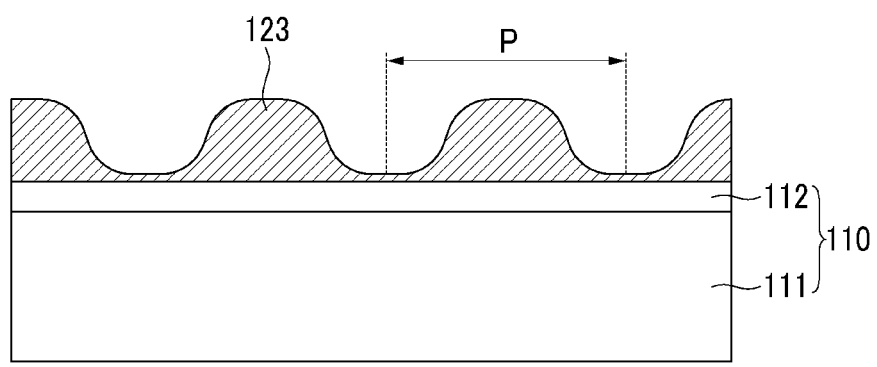

Similarly, as shown in FIG. 5, an exemplary embodiment of the isotropically etched portions of the upper dielectric layer 120 may have a structure wherein a plurality of convex portions 122 each having a convex lens shape is arranged regularly, instead of the plurality of recess portions having a concave lens shape shown in FIG. 1. In one exemplary embodiment, the plurality of convex portions 122 may be arranged irregularly. The plurality of convex portions 122 may refract substantially vertical incident light with a substantially large refraction angle, thereby passing it through the semiconductor substrate 110 along an inclined path instead of a substantially vertical path. Thus, the amount of light absorbed in the semiconductor substrate 110 may substantially increase. In one exemplary embodiment, as shown in FIG. 6, the isotropically etched portions of the upper dielectric layer 120 may be arranged in a shape of protrusion and depression portions 123 wherein the depressed portions each have a concave lens shape and the protrusion portions each have a convex lens shape are disposed regularly. In one exemplary embodiment, the protrusion and depression portions 123 where the depressed portions having a concave lens shape and the protrusion portions having a convex lens shape may be arranged irregularly.

In one exemplary embodiment, a surface of the semiconductor substrate 110 that is in contact with the upper dielectric layer 120 is not textured and is substantially flat.

If the surface of the semiconductor substrate 110 is textured, the semiconductor may be damaged by a chemical liquid or gas used during surface texturing, thereby generating a plurality of defects inside the semiconductor substrate 110 as well as on the surface of the semiconductor substrate 110. The plurality of defects may trap produced electrons or holes, thereby deteriorating solar cell efficiency and ultimately decreasing production amount of electrical energy.

In the present exemplary embodiment, the surface of the semiconductor substrate 110 is not textured to prevent generation of defects, while the surface of the upper dielectric layer 120 disposed on the surface of the semiconductor substrate 110 is isotropically etched to increase the amount of light absorbed in the semiconductor substrate 110. Thus, light entering the solar cell may be more effectively trapped, thereby substantially increasing light absorption, and electrons and holes produced by trapped light may be more effectively collected without substantial loss.

A plurality of front electrodes 130 is disposed on the upper dielectric layer 120. The plurality of front electrodes 130 extend side by side along one direction of the substrate, and penetrate the upper dielectric layer 120, thereby contacting the upper semiconductor layer 112. The plurality of front electrodes 130 may include a low resistance metal such as silver (Ag) and other materials with similar characteristics, and may be designed in a grid pattern considering shadowing loss and sheet resistance.

A front bus bar electrode (not shown) is disposed on the front electrode 130. The bus bar electrode is used to connect neighboring solar cells when a plurality of solar cells is assembled.

A lower dielectric layer 140 is disposed under the semiconductor substrate 110. The lower dielectric layer 140 may prevent charge recombination and prevent current leakage, thereby substantially increasing solar cell efficiency.

The lower dielectric layer 140 may include silicon oxide, silicon nitride, aluminum oxide, other materials with similar characteristics, or combinations thereof, for example, and it may have a thickness of about 100 angstrom (Å) to about 2000 Å.

A rear electrode 150 is disposed under the lower dielectric layer 140. The rear electrode 150 may include an opaque metal such as aluminum (Al), for example, and it may have a thickness of about 2 μm to about 50 μm. In one exemplary embodiment, the rear electrode 150 penetrates a part of the lower dielectric layer 140 to contact the lower semiconductor layer 111.

At the contact portion between the lower semiconductor layer 111 and the rear electrode 150, aluminum functions as a p-type impurity when silicon and aluminum contact each other to form an internal electric field therebetween, thus preventing movement of electrons to the rear side. Thereby, charge recombination and extinction at the rear side may be substantially prevented, thereby substantially increasing solar cell efficiency.

Hereinafter, an exemplary embodiment of a method of manufacturing the exemplary embodiment of a solar cell according to the present invention will be explained with reference to FIGS. 3A to 3C and FIG. 1.

Figure 3A:
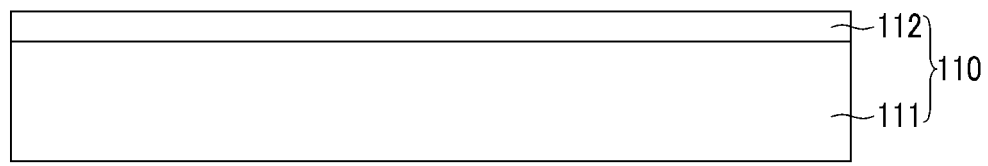
FIG. 3A to FIG. 3C are cross-sectional views sequentially showing an exemplary of a method of manufacturing the solar cell according to the present invention.
Figure 3B:
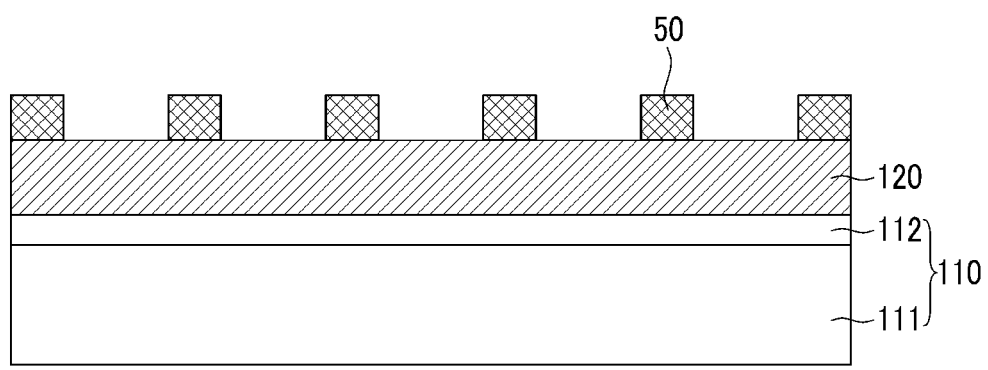
Figure 3C:
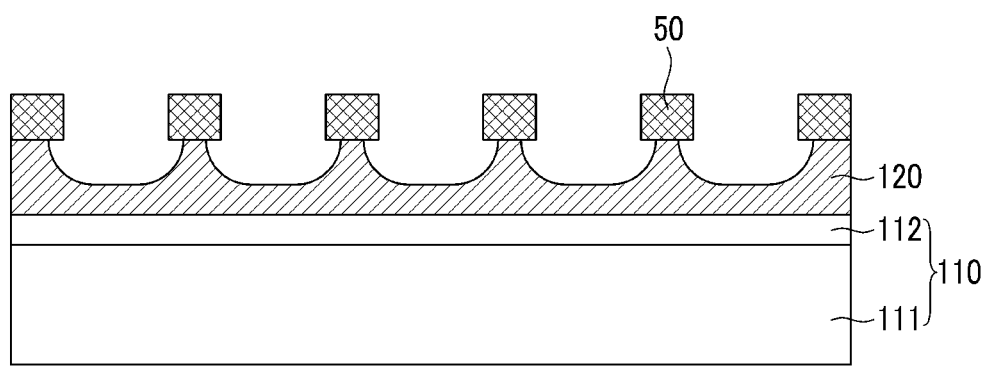

FIGS. 3A to 3C are cross-sectional views sequentially showing an exemplary embodiment of a method of manufacturing the solar cell according to the present invention.

First, a semiconductor substrate 110 such as a silicon wafer, for example, is prepared. The semiconductor substrate 110 may be doped with, for example, a p-type impurity.

Subsequently, the semiconductor substrate 110 is doped with, for example, an n-type impurity. The n-type impurity may be doped by diffusing phosphorus chloride oxide (POCl3) or phosphoric acid (H3PO4), or other materials with similar characteristics, at a high temperature. Thereby, as shown in FIG. 3A, the semiconductor substrate 110 includes a lower semiconductor layer 111 and an upper semiconductor layer that are doped with different impurities from each other.

Then, referring to FIG. 3B, an upper dielectric layer 120 is disposed on the semiconductor substrate 110.

The upper dielectric layer 120 may be formed of a material having a lower refractive index and absorbing less light than the semiconductor substrate 110, and for example, it may be formed by plasma enhanced chemical vapor deposition ("PECVD") using silicon oxide, silicon nitride, silicon oxynitride, aluminum oxide, other materials with similar characteristics, or a combination thereof.

Subsequently, a photosensitive layer (not shown) may be coated and patterned on the dielectric layer 120 to form a plurality of photosensitive patterns 50.

Then, referring to FIG. 3C, wet etching of the upper dielectric layer 120 is conducted using the plurality of photosensitive patterns 50 as a mask. The wet etching may be conducted using an acid-containing solution, and for example, hydrofluoric acid (HF) may be used, but is not limited thereto and other various methods and materials may be used for the wet etching.

According to the wet etching, a surface of the upper dielectric layer 120 may be isotropically etched, and a shape of a plurality of concave lens may be formed on the surface of the upper dielectric layer 120.

If the isotropically etched portions are regularly arranged, it may have a pitch of about 0.5 μm or more, and preferably about 0.5 μm to about 2 μm. If the isotropically etched portion has a pitch within the above range, it may substantially efficiently absorb light and refract it in the semiconductor layer.

Subsequently, the plurality of photosensitive patterns 50 is removed.

Next, referring to FIG. 1, a front electrode 130 is formed on the upper dielectric layer 120, and a lower dielectric layer 140 and a rear electrode 150 are formed under the semiconductor substrate 110.

Now, another exemplary embodiment of a solar cell according to the present invention will be explained with reference to FIG. 4.

Figure 4:
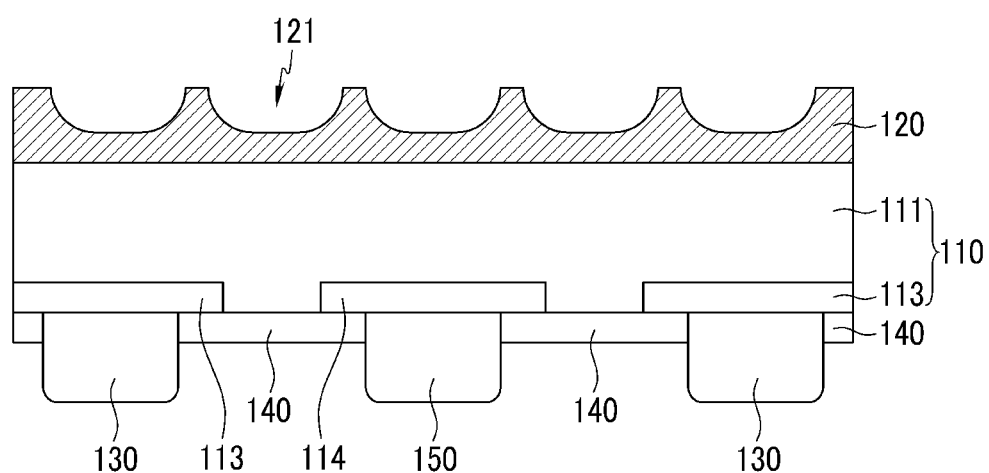
FIG. 4 is cross-sectional view of another exemplary embodiment of a solar cell according to the present invention.

FIG. 4 is a cross-sectional view of another exemplary embodiment of a solar cell according to the present invention.

Referring to FIG. 4, the semiconductor substrate 110 includes a semiconductor layer 111 doped with a p-type or an n-type impurity, and a plurality of impurity doping regions 113 and 114 that are doped with different impurities from each other. The first doping region 113 may be doped with, for example, a p-type impurity, and the second doping region 114 may be doped with, for example, an n-type impurity, and the first doping region 113 and the second doping region 114 may be alternatively disposed.

An upper dielectric layer 120 having isotropically etched portions 121 is formed on the front side of the semiconductor substrate 110. The upper dielectric layer 120 may be the same as the upper dielectric layer of the exemplary embodiment in FIG. 1.

A lower dielectric layer 140 is formed under the semiconductor layer 110, and a front electrode 130 and a rear electrode 150 are respectively formed on the lower dielectric layer 140. The front electrode 130 and the rear electrode 150 may be alternatively disposed. The front electrode 130 and the rear electrode 150 may penetrate the lower dielectric layer 140 by firing to contact the first doping region 113 and the second doping region 114, respectively.

In the present exemplary embodiment of the solar cell according to the present invention, unlike the exemplary embodiment of the solar cell of FIG. 1, both the front electrode 130 and the rear electrode 150 are disposed on the rear side of the solar cell. Therefore, an area occupied by metal at the front side of the solar cell may be reduced, thereby substantially increasing the amount of light inflow in the semiconductor substrate 110 through the isotropically etched portions 121 of the upper dielectric layer 120 among the light entering the front side of the solar cell.

The light passing through the isotropically etched portions 121 of the upper dielectric layer 120 and entering the semiconductor substrate 110 passes the semiconductor substrate 110 with an inclined refraction angle due to the isotropically etched portions 121, and thus a light pathway through the semiconductor substrate 110 may be substantially lengthened, thereby substantially increasing the amount of light absorbed in the semiconductor substrate 110. Accordingly, loss of light entering the solar cell due to electrode reflection may be substantially reduced, and the amount of light absorbed in the semiconductor substrate 110 may be substantially increased by the isotropically etched portions 121 of the upper dielectric layer 120, thereby substantially increasing solar cell efficiency.

While this disclosure has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A method for manufacturing a solar cell, the method comprising:
    providing a semiconductor layer including a p-type impurity-containing layer and an n-type impurity-containing layer;
    disposing a dielectric layer on a front side of the semiconductor layer;
    disposing a photosensitive pattern on the dielectric layer;
    isotropically etching a surface of the dielectric layer using the photosensitive pattern;
    a first electrode electrically connected with the p-type impurity-containing layer; and
    a second electrode electrically connected with the n-type impurity-containing layer.

2. The method of claim 1, wherein isotropic etching of the surface of the dielectric layer is performed by a wet method using an acid-containing solution.

3. The method of claim 2, wherein the isotropically etched surface of the dielectric layer includes a plurality of concave lens shapes.

4. The method of claim 2, wherein the isotropically etched surface of the dielectric layer has a pitch of at least about 0.5 μm.

5. The method of claim 4, wherein the isotropically etched surface of the dielectric layer has a pitch of about 0.5 μm to about 2 μm.

6. The method of claim 1, wherein the dielectric layer has a lower refractive index than a refractive index of the semiconductor layer.

7. The method of claim 1, wherein the dielectric layer has a refractive index of about 1.1 to about 2.2, and the semiconductor layer has a refractive index of about 3.4 to about 4.4.

8. The method of claim 1, wherein the dielectric layer includes at least one of silicon oxide, silicon nitride, silicon oxynitride, aluminum oxide, and a combination thereof.

* * * * *